US011936358B2

(12) United States Patent
Dyer et al.

(10) Patent No.: US 11,936,358 B2
(45) Date of Patent: *Mar. 19, 2024

(54) TRANSVERSELY-EXCITED FILM BULK ACOUSTIC RESONATOR WITH LOW THERMAL IMPEDANCE

(71) Applicant: Murata Manufacturing Co., Ltd., Nagaokakyo (JP)

(72) Inventors: Greg Dyer, Santa Barbara, CA (US); Chris O'Brien, San Diego, CA (US); Neal O. Fenzi, Santa Barbara, CA (US); James R. Costa, Lompoc, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 217 days.

This patent is subject to a terminal disclaimer.

(21) Appl. No.: 17/217,923

(22) Filed: Mar. 30, 2021

(65) Prior Publication Data

US 2022/0149807 A1    May 12, 2022

Related U.S. Application Data

(60) Provisional application No. 63/112,395, filed on Nov. 11, 2020.

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/02; H03H 9/02031; H03H 9/02102; H03H 9/132;
(Continued)

(56) References Cited

U.S. PATENT DOCUMENTS

| 5,446,330 A | 8/1995 | Eda et al. |
| 5,552,655 A | 9/1996 | Stokes et al. |

(Continued)

FOREIGN PATENT DOCUMENTS

| CN | 106788318 A | 5/2017 |
| CN | 110417373 A | 11/2019 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.

(Continued)

*Primary Examiner* — Rakesh B Patel
*Assistant Examiner* — Jorge L Salazar, Jr.
(74) *Attorney, Agent, or Firm* — ARENTFOX SCHIFF LLP

(57) ABSTRACT

An acoustic resonator device with low thermal impedance has a substrate and a single-crystal piezoelectric plate having a back surface attached to a top surface of the substrate via a bonding oxide (BOX) layer. An interdigital transducer (IDT) formed on the front surface of the plate has interleaved fingers disposed on the diaphragm. The piezoelectric plate and the BOX layer are removed from a least a portion of the surface area of the device to provide lower thermal resistance between the conductor pattern and the substrate.

20 Claims, 14 Drawing Sheets

(51) Int. Cl.
  *H03H 9/13* (2006.01)
  *H03H 9/17* (2006.01)
  *H03H 9/56* (2006.01)

(52) U.S. Cl.
  CPC ........ *H03H 9/02102* (2013.01); *H03H 9/132* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01)

(58) Field of Classification Search
  CPC ........ H03H 9/174; H03H 9/176; H03H 9/562; H03H 9/564; H03H 9/568; H03H 2003/023; H03H 2003/021; H03H 9/0514; H03H 9/173; H03H 9/02015; H03H 9/02047; H03H 9/02062; H03H 9/582
  USPC .......................................... 333/133, 193–196
  See application file for complete search history.

(56) References Cited

U.S. PATENT DOCUMENTS

| | | | |
|---|---|---|---|
| 5,726,610 | A | 3/1998 | Allen et al. |
| 5,853,601 | A | 12/1998 | Krishaswamy |
| 6,377,140 | B1 | 4/2002 | Ehara et al. |
| 6,516,503 | B1 | 2/2003 | Ikada et al. |
| 6,540,827 | B1 | 4/2003 | Levy et al. |
| 6,707,229 | B1 | 3/2004 | Martin |
| 6,710,514 | B2 | 3/2004 | Ikada et al. |
| 7,042,132 | B2 | 5/2006 | Bauer et al. |
| 7,345,400 | B2 | 3/2008 | Nakao et al. |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,728,483 | B2 | 6/2010 | Tanaka |
| 7,868,519 | B2 | 1/2011 | Umeda |
| 7,939,987 | B1 | 5/2011 | Solal et al. |
| 7,941,103 | B2 | 5/2011 | Iwamoto |
| 8,278,802 | B1 | 10/2012 | Lee et al. |
| 8,294,330 | B1 | 10/2012 | Abbott et al. |
| 8,344,815 | B2 | 1/2013 | Yamanaka |
| 8,816,567 | B2 | 8/2014 | Zuo et al. |
| 8,829,766 | B2 | 9/2014 | Milyutin |
| 8,932,686 | B2 | 1/2015 | Hayakawa et al. |
| 9,093,979 | B2 | 7/2015 | Wang |
| 9,112,134 | B2 | 8/2015 | Takahashi |
| 9,130,145 | B2 | 9/2015 | Martin et al. |
| 9,219,466 | B2 | 12/2015 | Meltaus et al. |
| 9,240,768 | B2 | 1/2016 | Nishihara et al. |
| 9,276,557 | B1 | 3/2016 | Nordquist et al. |
| 9,369,105 | B1 | 6/2016 | Li et al. |
| 9,425,765 | B2 | 8/2016 | Rinaldi |
| 9,525,398 | B1 | 12/2016 | Olsson |
| 9,640,750 | B2 | 5/2017 | Nakanishi et al. |
| 9,748,923 | B2 | 8/2017 | Kando |
| 9,762,202 | B2 | 9/2017 | Thalmayr et al. |
| 9,780,759 | B2 | 10/2017 | Kimura et al. |
| 9,837,984 | B2 | 12/2017 | Khlat et al. |
| 10,079,414 | B2 | 9/2018 | Guyette |
| 10,187,039 | B2 | 1/2019 | Komatsu et al. |
| 10,200,013 | B2 | 2/2019 | Bower |
| 10,211,806 | B2 | 2/2019 | Bhattacharjee |
| 10,284,176 | B1 | 5/2019 | Solal |
| 10,389,391 | B2 | 8/2019 | Ito et al. |
| 10,491,192 | B1 | 11/2019 | Plesski et al. |
| 10,601,392 | B2 | 3/2020 | Plesski |
| 10,637,438 | B2 | 4/2020 | Garcia |
| 10,644,674 | B2 | 5/2020 | Takamine |
| 10,756,697 | B2 | 8/2020 | Plesski |
| 10,790,802 | B2 | 9/2020 | Yantchev |
| 10,797,675 | B2 | 10/2020 | Plesski |
| 10,819,309 | B1 | 10/2020 | Turner et al. |
| 10,826,462 | B2 | 11/2020 | Plesski et al. |
| 10,868,510 | B2 | 12/2020 | Yantchev |
| 10,868,512 | B2 | 12/2020 | Garcia |
| 10,917,070 | B2 | 2/2021 | Plesski |
| 10,985,728 | B2 | 4/2021 | Plesski et al. |
| 11,146,232 | B2 | 10/2021 | Yandrapalli et al. |
| 11,201,601 | B2 | 12/2021 | Yantchev et al. |
| 11,418,167 | B2 | 8/2022 | Garcia |
| 2002/0079986 | A1 | 6/2002 | Ruby et al. |
| 2002/0158714 | A1 | 10/2002 | Kaitila et al. |
| 2002/0189062 | A1 | 12/2002 | Lin et al. |
| 2003/0080831 | A1 | 5/2003 | Naumenko et al. |
| 2003/0199105 | A1 | 10/2003 | Kub et al. |
| 2004/0041496 | A1 | 3/2004 | Imai et al. |
| 2004/0100164 | A1 | 5/2004 | Murata |
| 2004/0261250 | A1 | 12/2004 | Kadota et al. |
| 2005/0099091 | A1 | 5/2005 | Mishima et al. |
| 2005/0185026 | A1 | 8/2005 | Noguchi et al. |
| 2005/0218488 | A1 | 10/2005 | Matsuo |
| 2005/0264136 | A1 | 12/2005 | Tsutsumi et al. |
| 2006/0179642 | A1 | 8/2006 | Kawamura |
| 2007/0182510 | A1 | 8/2007 | Park |
| 2007/0188047 | A1 | 8/2007 | Tanaka |
| 2007/0194863 | A1 | 8/2007 | Shibata et al. |
| 2007/0267942 | A1 | 11/2007 | Matsumoto et al. |
| 2007/0296304 | A1 | 12/2007 | Fujii et al. |
| 2008/0246559 | A1 | 10/2008 | Ayazi |
| 2008/0297280 | A1 | 12/2008 | Thalhammer et al. |
| 2009/0315640 | A1 | 12/2009 | Umeda et al. |
| 2010/0064492 | A1 | 3/2010 | Tanaka |
| 2010/0102669 | A1 | 4/2010 | Yamanaka |
| 2010/0123367 | A1 | 5/2010 | Tai et al. |
| 2010/0212127 | A1 | 8/2010 | Heinze et al. |
| 2010/0301703 | A1 | 12/2010 | Chen et al. |
| 2011/0018389 | A1 | 1/2011 | Fukano et al. |
| 2011/0018654 | A1 | 1/2011 | Bradley et al. |
| 2011/0102107 | A1 | 5/2011 | Onzuka |
| 2011/0109196 | A1 | 5/2011 | Goto et al. |
| 2011/0199163 | A1 | 8/2011 | Yamanaka |
| 2011/0278993 | A1 | 11/2011 | Iwamoto |
| 2012/0286900 | A1 | 11/2012 | Kadota et al. |
| 2013/0057360 | A1 | 3/2013 | Meltaus et al. |
| 2013/0207747 | A1 | 8/2013 | Nishii et al. |
| 2013/0234805 | A1 | 9/2013 | Takahashi |
| 2013/0271238 | A1 | 10/2013 | Onda |
| 2013/0278609 | A1 | 10/2013 | Stephanou et al. |
| 2013/0321100 | A1 | 12/2013 | Wang |
| 2014/0009032 | A1* | 1/2014 | Takahashi .......... H03H 9/02559 29/25.35 |
| 2014/0009247 | A1 | 1/2014 | Moriya |
| 2014/0113571 | A1 | 4/2014 | Fujiwara et al. |
| 2014/0130319 | A1 | 5/2014 | Iwamoto |
| 2014/0145556 | A1 | 5/2014 | Kadota |
| 2014/0151151 | A1 | 6/2014 | Reinhardt |
| 2014/0152145 | A1 | 6/2014 | Kando et al. |
| 2014/0173862 | A1 | 6/2014 | Kando et al. |
| 2014/0225684 | A1 | 8/2014 | Kando et al. |
| 2015/0014795 | A1 | 1/2015 | Franosch et al. |
| 2015/0042417 | A1 | 2/2015 | Onodera et al. |
| 2015/0244149 | A1 | 8/2015 | Van Someren |
| 2015/0319537 | A1 | 11/2015 | Perois et al. |
| 2015/0333730 | A1 | 11/2015 | Meltaus et al. |
| 2016/0028367 | A1 | 1/2016 | Shealy |
| 2016/0036415 | A1 | 2/2016 | Ikeuchi |
| 2016/0079958 | A1 | 3/2016 | Burak |
| 2016/0149554 | A1 | 5/2016 | Nakagawa |
| 2016/0182009 | A1 | 6/2016 | Bhattacharjee |
| 2016/0285430 | A1 | 9/2016 | Kikuchi et al. |
| 2017/0063332 | A1 | 3/2017 | Gilbert |
| 2017/0104470 | A1 | 4/2017 | Koelle et al. |
| 2017/0179928 | A1 | 6/2017 | Raihn et al. |
| 2017/0187352 | A1 | 6/2017 | Omura |
| 2017/0201232 | A1 | 7/2017 | Nakamura et al. |
| 2017/0214381 | A1 | 7/2017 | Bhattacharjee |
| 2017/0214387 | A1 | 7/2017 | Burak et al. |
| 2017/0222617 | A1 | 8/2017 | Mizoguchi |
| 2017/0222622 | A1 | 8/2017 | Solal et al. |
| 2017/0264266 | A1 | 9/2017 | Kishimoto |
| 2017/0290160 | A1 | 10/2017 | Takano et al. |
| 2017/0359050 | A1 | 12/2017 | Irieda et al. |

(56) References Cited

U.S. PATENT DOCUMENTS

| | | |
|---|---|---|
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0316333 A1 | 11/2018 | Nakamura et al. |
| 2019/0007022 A1* | 1/2019 | Goto .................. H03H 9/0585 |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin |
| 2019/0348966 A1 | 11/2019 | Campanella-Pineda |
| 2019/0386638 A1 | 12/2019 | Kimura et al. |
| 2020/0021272 A1 | 1/2020 | Segovia Fernandez et al. |
| 2020/0036357 A1 | 1/2020 | Mimura |
| 2020/0228087 A1 | 7/2020 | Michigami et al. |
| 2020/0235719 A1 | 7/2020 | Yantchev et al. |
| 2020/0244247 A1 | 7/2020 | Maeda |
| 2020/0295729 A1 | 9/2020 | Yantchev |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2021/0273631 A1 | 9/2021 | Jachowski et al. |
| 2021/0313951 A1 | 10/2021 | Yandrapalli et al. |
| 2021/0328575 A1 | 10/2021 | Hammond et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| CN | 210431367 U | 4/2020 |
| CN | 113765495 A | 12/2021 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2017526254 A | 9/2017 |
| JP | 2017220910 A | 12/2017 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2017188342 A1 | 11/2017 |
| WO | 2018003273 | 1/2018 |
| WO | 2018163860 A1 | 9/2018 |
| WO | 2019138810 A1 | 7/2019 |
| WO | 2020092414 A2 | 5/2020 |
| WO | 2020100744 A1 | 5/2020 |

OTHER PUBLICATIONS

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945 Jan. 22, 2017.

International Search Report and Written Opinion for PCT Application No. PCT/2019/036433, dated Aug. 29, 2019.

Buchanan "Ceramit Materials for Electronics"3rd Edition, first published in 2004 by Marcel Dekker, Inc. pp. 496 (Year 2004). Jan. 00, 2004.

Acoustic Properties of SolidsONDA Corporation592 Weddell Drive, Sunnyvale, CA 94089, Apr. 11, 2003, pp. 5 (Year 2003) Apr. 11, 2003.

Sorokin et al.Study of Microwave Acoustic Attenuation in a Multi-frequency Bulk Acoustic Resonator Based on a Synthetic Diamond Single CrystalPublished in Acoustical Physics, vol. 61, No. 6, 2015 pp. 675 (Year 2015) Jan. 00, 2015.

Zou, Jie "High-Performance Aluminum Nitride Lamb Wave Resonators for RF Front-End Technology" University of California, Berkeley, Summer 2015, pp. 63 (Year 2015) Jan. 00, 2015.

International Search Report and Written Opinion for PCT Application No. PCT/US2019/058632 dated Jan. 17, 2020, dated Jan. 17, 2020.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Bahreyni, B. Fabrication and Design of Resonant Microdevices Andrew William, Inc. 2018, NY (Year 2008). 2008.

Material Properties of Tibtech Innovations, © 2018 TIBTECH Innovations (Year 2018). 2018.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. 2014.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. 2018.

G. Manohar, "Investigation of Various Surface Acoustic Wave Design Configurations for Improved Sensitivity." Doctoral dissertation, University of South Florida, USA, Jan. 2012, 7 pages. 2012.

Ekeom, D. & Dubus, Bertrand & Volatier, A.. (2006). Solidly mounted resonator (SMR) FEM-BEM simulation. 1474-1477. 10.1109/ULTSYM.2006.371. 2006.

Mizutaui, K. and Toda, K., "Analysis of lamb wave propagation characteristics in rotated Ycut Xpropagation LiNbO3 plates." Elec-

(56) References Cited

OTHER PUBLICATIONS tron. Comm. Jpn. Pt. I, 69, No. 4 (1986): 47-55. doi:10.1002/ecja.4410690406 1986.

Naumenko et al., "Optimal orientations of Lithium Niobate for resonator SAW filters", 2003 IEEE Ultrasonics Symposium—pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Chen et al., "Development and Application of SAW Filter," Micromachines, 2022-04-20, vol. 13, No. 656, pp. 1-15.

Hermann et al., "Properties of shear-horizontal surface acoustic waves in different layered quartz-SiO2 structures," Ultrasonics, 1999, vol. 37, pp. 335-341.

International Search Report and Written Opinion in PCT/US2022/081068, dated Apr. 18, 2023, 17 pages.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, 2015, vol. 62, No. 5, pp. 939-946.

Gorisse et al., "Lateral Field Excitation of membrane-based Aluminum Nitride resonators", 2011 Joint Conference of the IEEE International Frequency Control and the European Frequency and Time Forum (FCS) Proceedings, 5 pages.

Pang et al. "Self-Aligned Lateral Field Excitation Film Acoustic Resonator with Very Large Electromechanical Coupling", 2004 IEEE International Ultrasonics, Ferroelectrics and Frequency Control Joint 50th Anniversary Conference, pp. 558-561.

Xue et al. "High Q Lateral-Field-Excited Bulk Resonator Based on Single-Crystal LiTaO3 for 5G Wireless Communication", Journal of Electron devices society, vol. 9, Mar. 26, 2021, pp. 353-358.

Yandrapalli et al., "Toward Band n78 Shear Bulk Acoustic Resonators Using Crystalline Y-Cut Lithium Niobate Films with Spurious Suppression", Journal of Microelectromechanical Systems, vol. 32, No. 4, Aug. 2023, pp. 327-334.

\* cited by examiner

| Thermal Conductivity of the Materials | |
|---|---|
| SiO2 | 1.3 W/m-K |
| LN | 4.6 W/m-K |
| Au | 320 W/m-K |
| Al | 205 W/m-K |

| Design Parameters | | | | | | |
|---|---|---|---|---|---|---|
| R_nodes_|| (K/W) | # bumps | R_node (K/W) | Bump Diameter (um) | T_Box (um) | T_LN (um) | T_bump (um) |
| 23 | 6 | 136 | 75.0 | 2.0 | 0.5 | 37.5 |
| 4 | 6 | 22 | 75.0 | 2.0 | 0.5 | 37.5 |

FIG. 4A

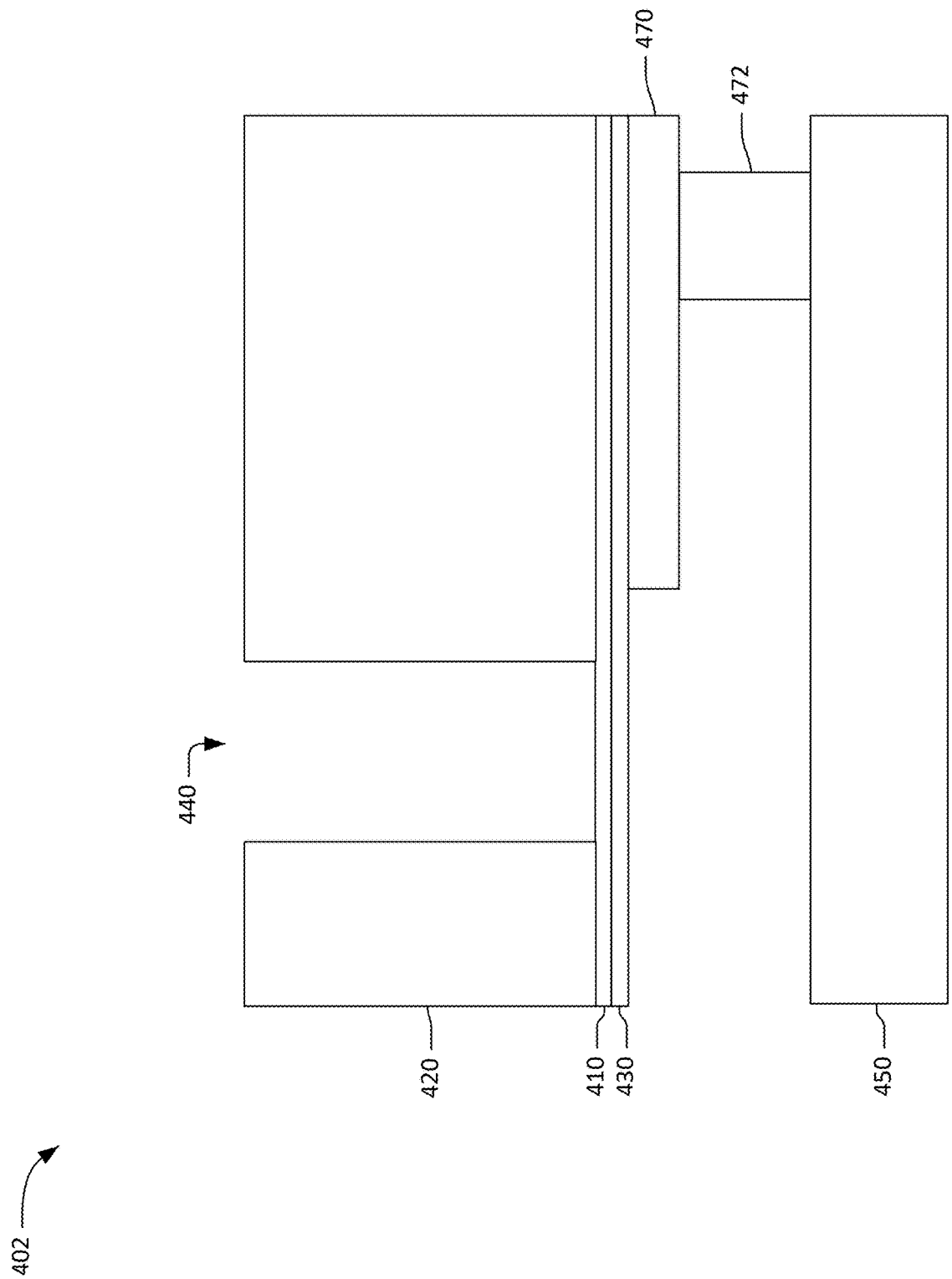

TRANSVERSELY-EXCITED FILM BULK ACOUSTIC RESONATOR WITH LOW THERMAL IMPEDANCE

RELATED APPLICATION INFORMATION

This patent claims priority to U.S. provisional patent application No. 63/112,395, titled XBAR WITH LOW THERMAL IMPEDANCE, filed Nov. 11, 2020.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 4A is a table showing an example of a calculation with design parameters of an XBAR device with and without removing a predetermined area of a bonding oxide layer (BOX) and a piezoelectric layer from selected locations.

FIGS. 4B and 4C are a block diagram and a flow diagram showing generalized cross section and thermal circuit, respectively, of an XBAR device without removing a predetermined area of a BOX and a piezoelectric layer from selected locations.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

The primary mechanism for removing heat from the XBAR diaphragm is conduction through the IDT fingers to the substrate. The heat from the diaphragm may be conducted through the finger to other parts of the conductor pattern and then to the substrate. However, the IDT busbars and other conductors of the conductor pattern are typically separated from the substrate by the piezoelectric layer and a layer of bonding oxide (BOX). The low thermal conductivity of the piezoelectric layer and BOX presents a substantial barrier to efficient heat removal.

The following describes improved XBAR resonators, filters and fabrication techniques for XBAR resonators that efficiently conduct heat from the IDT or busbars to the substrate. This can be done by removing a predetermined area of the bonding layer (e.g., BOX) and/or piezoelectric layer from selected locations of the surface of the substrate of the device to provide a predetermined amount in reduction of thermal resistance between the conductor pattern and the substrate.

Figure 1:
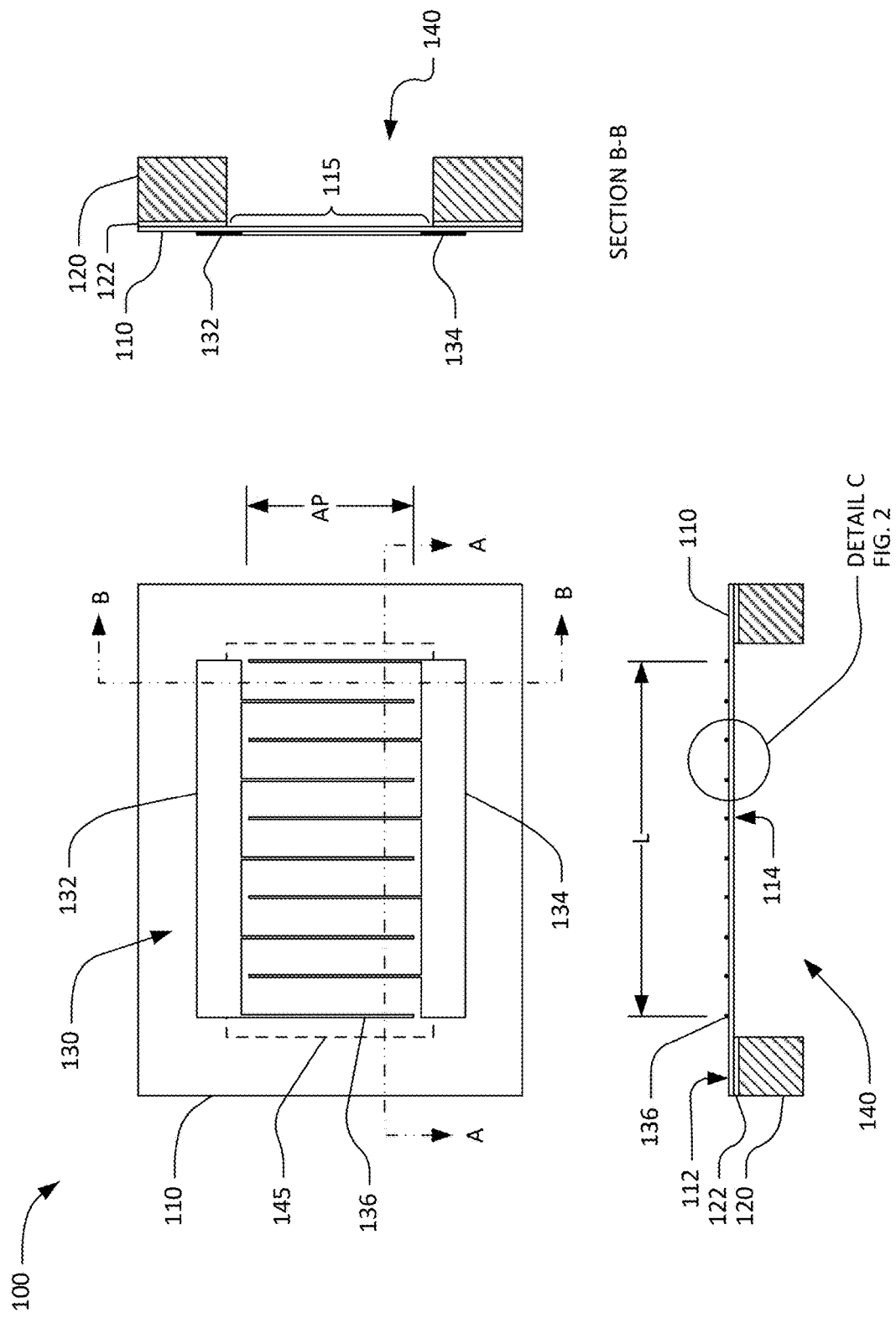
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as Al2O3. As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
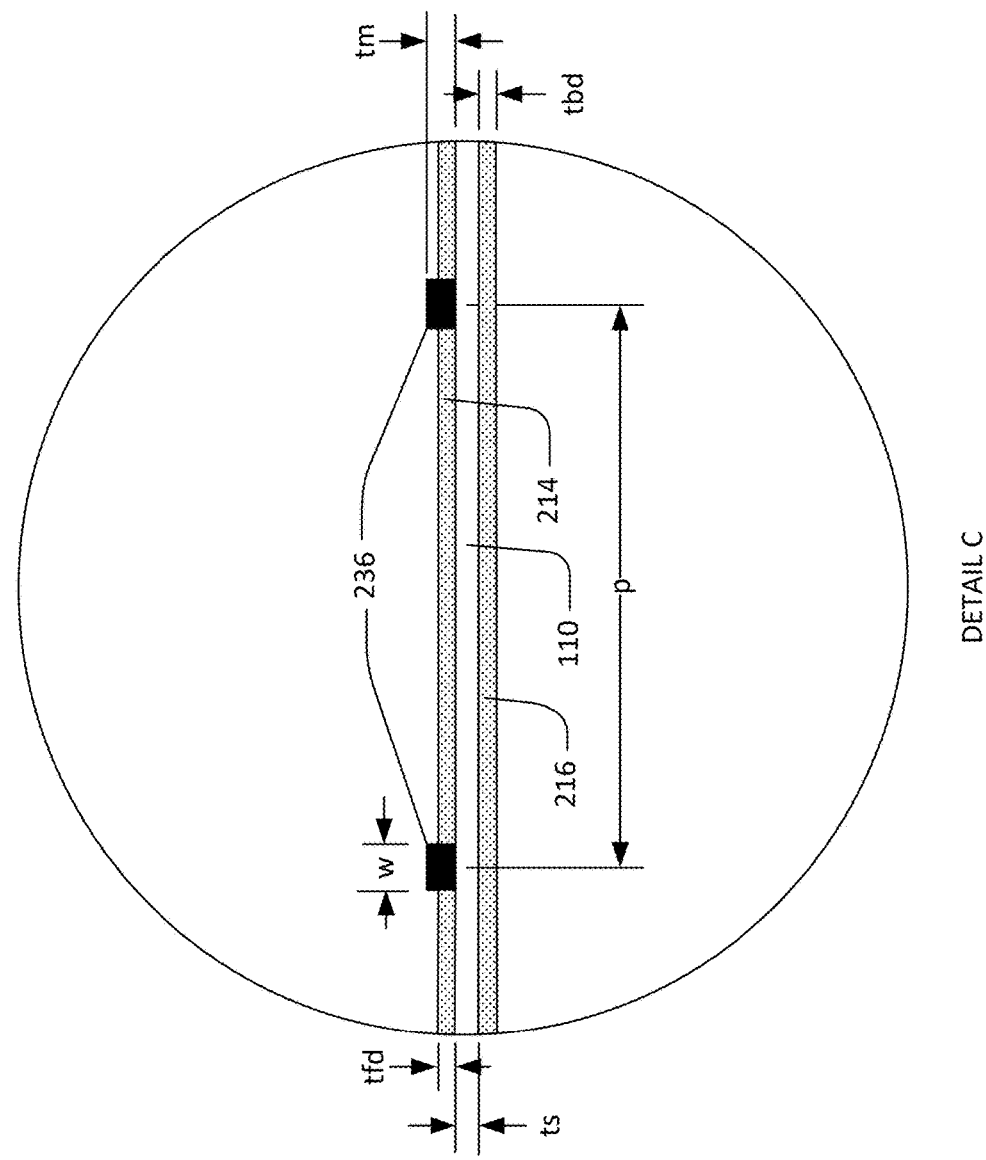
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness is of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
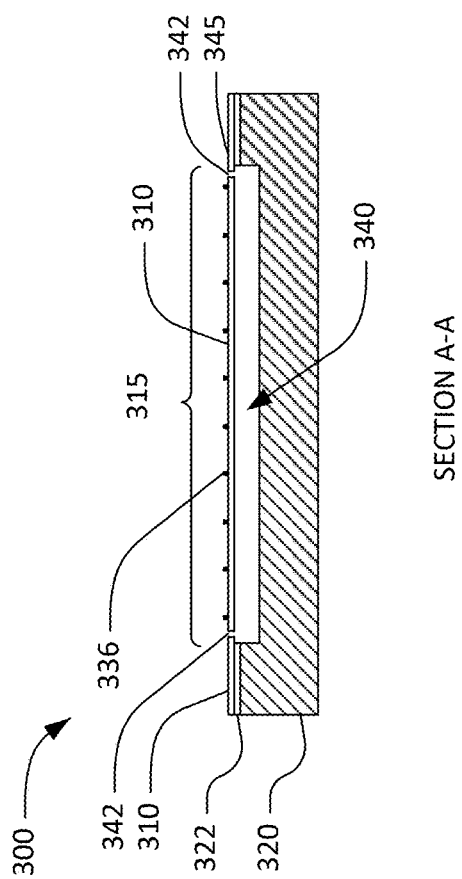
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be or include a bonding layer, a BOX layer, an etch stop layer, a sealing layer, an adhesive layer or layer of other material that is attached or bonded to plate 310 and substrate 320. Layers 322 may be one or more of any of these layers or a combination of these layers.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e., down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
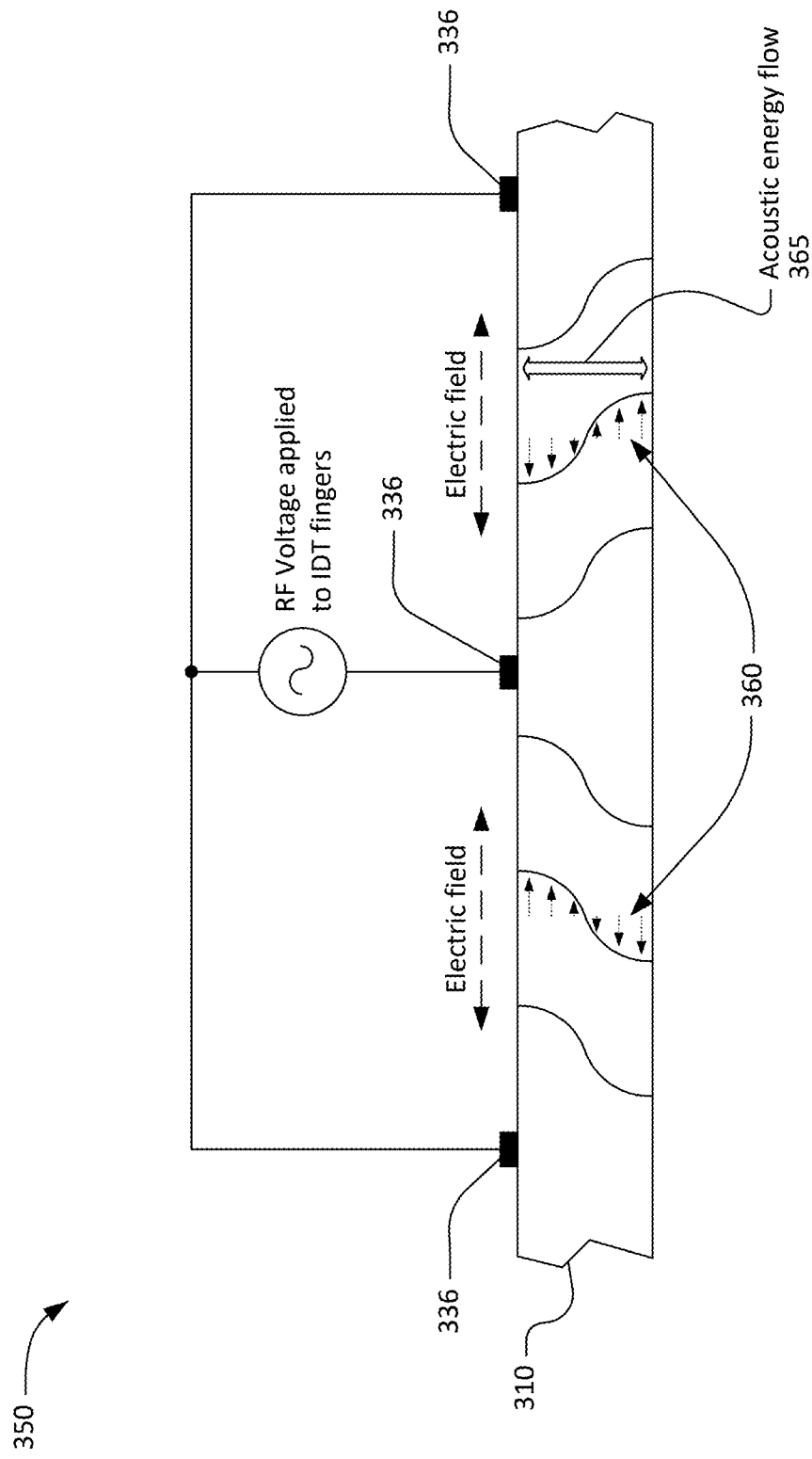
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 3C:
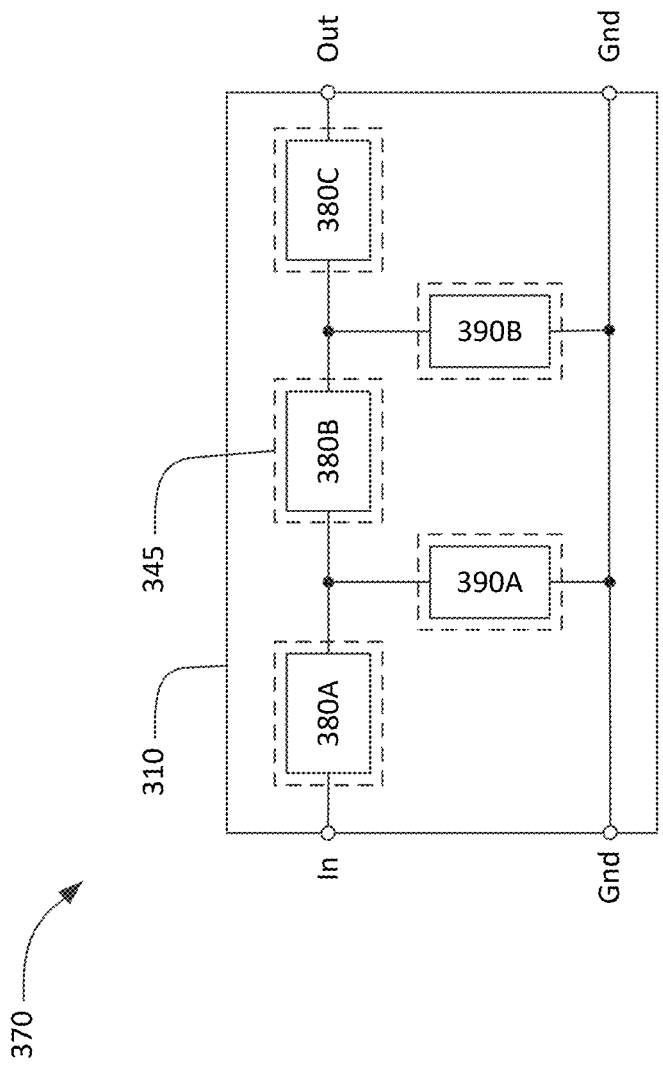
FIG. 3C is a schematic circuit diagram and layout for a high frequency band-pass filter using XBARs.

FIG. 3C is a schematic circuit diagram and layout for a high frequency band-pass filter 370 using XBARs. The filter 370 has a conventional ladder filter architecture including three series resonators 380A, 380B, 380C and two shunt resonators 390A, 390B. The three series resonators 380A, 380B, and 380C are connected in series between a first port and a second port. In FIG. 3C, the first and second ports are labeled "In" and "Out", respectively. However, the filter 370 is bidirectional and either port and serve as the input or output of the filter. The two shunt resonators 390A, 390B are connected from nodes between the series resonators to ground. All the shunt resonators and series resonators are XBARs on a single die.

The three series resonators 380A, B, C and the two shunt resonators 390A, B of the filter 370 are formed on a single plate 310 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 3C, the cavities are illustrated schematically as the dashed rectangles (such as the rectangle 345). In this example, each IDT is disposed over a respective cavity. In other filters, the IDTs of two or more resonators may be disposed over a single cavity.

FIG. 4A is a table 400 showing an example of a calculation with design parameters of an XBAR device with and without removing a predetermined area of a bonding oxide layer (BOX) and a piezoelectric layer from selected locations of the surface of the substrate of the device to provide a predetermined amount in reduction of thermal resistance between the conductor pattern and the substrate. Table 400 may be a spreadsheet estimate of BOX and a LN piezoelectric layer plate 110 impact on XBAR heat conduction.

The first row of table 400 shows the legend of data labels for the columns of the table. The second and third rows show the values in the columns for the simulations of an XBAR device without and then with (respectively) removing a predetermined area of a bonding oxide layer (BOX) and a piezoelectric layer from selected locations of the surface of the substrate of the device to provide a predetermined amount in reduction of thermal resistance between the conductor pattern and the substrate. References to "bumps" in the table may be to bonding pads, gold or solder bumps, or other means for making connection between the device (e.g., conductor layers or busbars) and external circuitry.

The table 400 has 9 columns showing in sequence: "R_nodes_II" as the aggregate value of the thermal resistance in Kelvins/Watt (K/W) for the 6 bumps shown in the next column; "#bumps" as the number of bumps; "R_node" as the thermal resistance in K/W for each of the bumps inclusive of series 'contact thermal resistance'; "Bump Diameter" which is the diameter of each bump; "T_Box" which is the thickness of the layer of BOX material; "T_LN" which is the thickness of the layer of LN or piezoelectric material; "T_bump" which is the thickness of the bump material. Columns 8 and 9 show the known thermal conductivity of SiO2 which is used for the BOX material in this simulation; Lithium Niobate (LN) which is the piezoelectric plate material in this simulation; Gold (Au) which is the bump material in this simulation; and Aluminum (Al) which is the IDT material in this simulation. This simulation may also use the block diagram 402 and flow diagram 404 of FIGS. 4B-C. The representative example of table 400 explicitly determines the contribution to the thermal resistance from 474 and 475 in flow diagram 404 of FIG. 4C.

Thermal resistance, such as for contacts, bumps, IDTs, resonator diaphragms, circuit boards or other components of the XBAR device may be simulated or measured in K/W. For planar materials where heat flow is orthogonal to the plane, Rt=L/kA where Rt is thermal resistance, L is plane thickness, such as of layer(s) of BOX and/or piezoelectric plate material; k is a thermal conductivity of the material; and A is the plane area, such as of layer(s) of BOX and/or piezoelectric plate material. The plane area A may also be an 'effective area' larger than the physical plane area at junctions of planar materials with different physical areas, in order to estimate contributions from thermal transport in the plane.

Table 400 shows that the 'thermal contact resistance' of the bonding oxide and LN between the metal IDT and the silicon substrate is significant in terms of heat conduction off of the die. Table 400 provides a version of a spreadsheet calculation indicating potential for >4× greater thermal resistance per bump with BOX and LN plate 110 in the second row, relative to without BOX and LN plate in the third row. The simulated 19 K/W decrease in thermal resistance without BOX can be a substantial fraction of the total device thermal resistance. 19 K/W may be between 10% and 30% of the total thermal resistance. The thermal resistance reduction lowers the temperature rise of an XBAR filter by 10% to 30% during continuous wave RF operation. The primary benefits of reduced XBAR filter operating temperature are extended operating life and higher output power in the highest frequency channels of the filter.

Figure 4C:
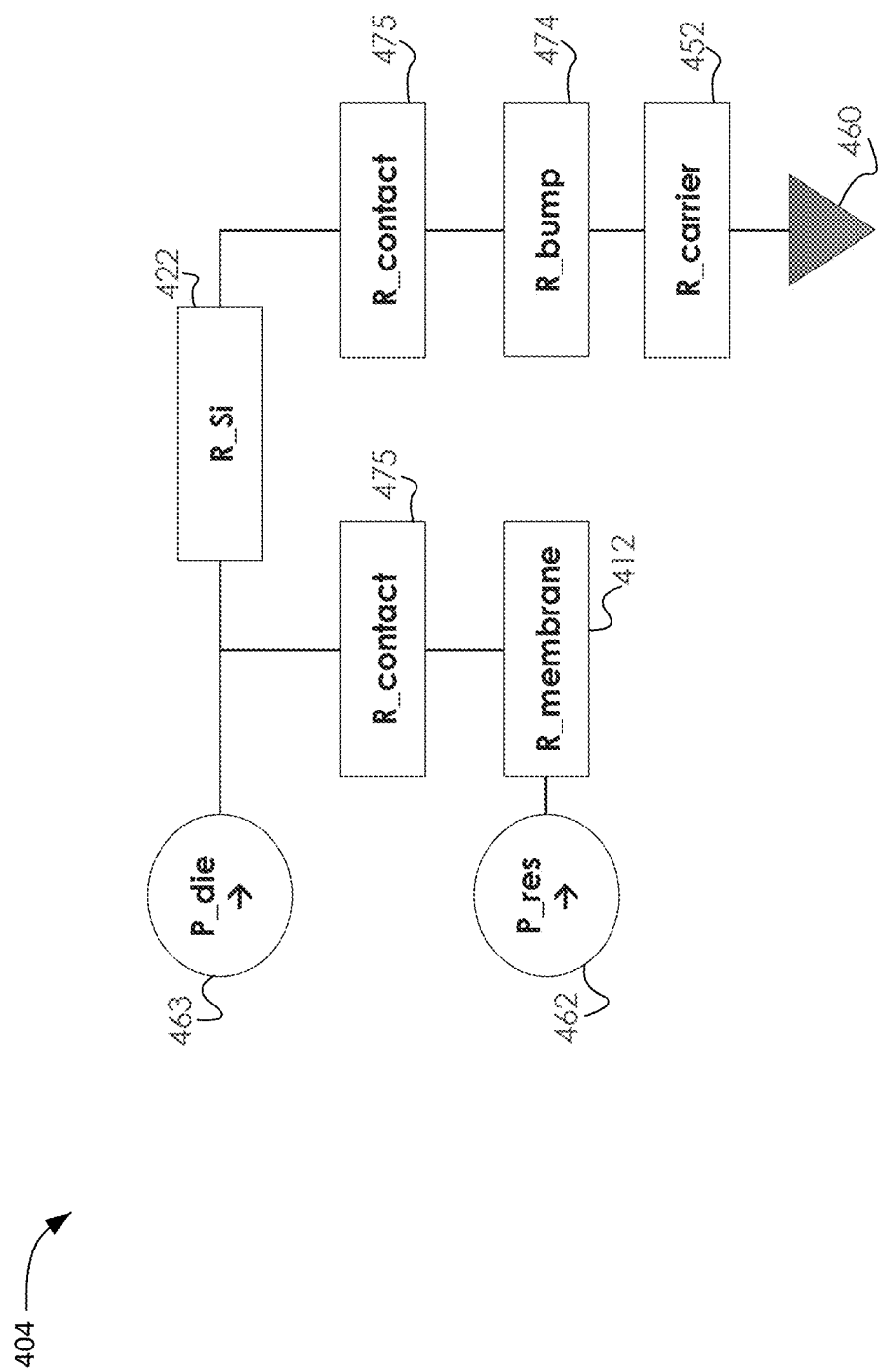

FIGS. 4B and 4C are a block diagram 402 and a flow diagram 404 showing generalized cross section and thermal circuit, respectively, of an XBAR device without removing a predetermined area of a bonding oxide layer (BOX) and a piezoelectric layer from selected locations of the surface of the substrate of the device to provide a predetermined amount in reduction of thermal resistance between the conductor pattern and the substrate.

The block diagram 402 and flow diagram 404 show silicon substrate 420 having corresponding substrate thermal resistance "R_Si" 422. Attached to the top of the substrate and suspended over cavity 440 in the substrate is LN piezoelectric plate 410. A layer of BOX attaches the plate to the substrate 420 around the perimeter of the cavity. Attached and extending over the top of plate 410 including over cavity 440 is metal layer M1 430. Plate 410 and layer M1 form a resonator have thermal resistance "R_membrane" 412. Attached to the top of layer M1 430 is contact metal layer M2 470 having corresponding M2 thermal resistance "R_contact" 475. Attached to layer M2 is gold bump 472 having corresponding bump thermal resistance "R_bump" 474. Attached to an opposing end of bump 472 is printed circuit board (PCB) 450 having corresponding PCB thermal resistance having corresponding thermal resistance "R_carrier" 452.

"P_res" 462 and "P_die" 463 represent the heat generated by the resonator and additional heating in the filter that is conducted through this path, respectively, during use. These additional losses may include heat generated by resonators not explicitly depicted in block diagram 402 and flow diagram 404, parasitic dissipation from electrical routing, and more generally other losses resulting from non-ideal conductor and dielectric materials. This heat is conducted to a heat sink 460 with temperature T_0. The steady state resonator temperature is derived from circuit theory as T_res=T_0+P_res*(R_membrane+R_contact)+P_res+ P_die)*(R_Si+R_contact+R_bump+R_carrier). The BOX thermal resistance "R_contact" 475 thus behaves as a bottleneck or 'choke point' because all heat dissipated in the filter is conducted through this layer.

The PCB 450 may be or include alumina (e.g., Al2O3) and/or tungsten (W). It may be formed by high-temperature co-fired ceramics (HTCC) with signal routing (e.g., vias, traces and contact pads). In some cases, the PCB 450 is a PCB laminate with copper (Cu). It may be formed by known PCB processes and have known signal routing. The material of layer M1 and layer M2 may be a metal or conductor as described for IDT 130. They may be the same material. They may be a different material. They may be formed during one or more different processing steps. These steps may be different than steps for forming the IDT.

The simulations of thermal resistance from table 400 for the respective cases of a device with and without BOX removed below the "bumps" are related to diagram 404 by the relation R_node=R_contact+R_bump. From this relation, the device significance of the 4× reduction in R_node with removal of BOX is estimated. Approximately half of the resonator temperature rise, T_res−T_0, is associated with R_Si 422, R_contact 475, R_bump 474, and R_carrier 452 in diagram 404. Furthermore, R_node by itself may constitute 20% to 40% of the resonator temperature rise. Therefore, removal of the BOX is expected to reduce total resonator thermal resistance by 10% to 30%, depending on the specific attributes of the filter and its resonators.

To produce improved XBAR resonators and filters that efficiently conduct heat from the IDT or busbars to the substrate, predetermined areas of the bonding layer (e.g., BOX) and/or piezoelectric layer can be removed from selected locations of the surface of the substrate of the device to provide a predetermined amount in reduction of thermal resistance between the conductor pattern and the substrate. The predetermined areas removed from the selected locations may be described as excess BOX and piezoelectric material that is removed because their removal does not affect or change the filtering performance (e.g., frequency range passed) by the filter. In some cases, the removal may change the performance by less than 5 percent of the frequency range and/or wave pass amplitude. In some cases, it is by less than 10 percent. It may be by less than 3 percent.

In some cases, to produce improved XBAR resonators and filters with excess BOX and piezoelectric material removed, the portions or areas of the BOX (e.g., layer 322, 522 or 582) and piezoelectric material of a plate or layer (e.g., layer 110, 310, 410 or 510) that extend a certain distance past the cavity perimeter 145 or 345 of the cavities of filter 100 or 370 (or around portion 115) may be removed. This removing may include removing the BOX and piezoelectric material: a) that extends in the length direction past the perimeter of the cavity by between 2 and 25 percent more the length of the cavity; and b) that extends in the width direction past the perimeter of the cavity by between 2 and 25 percent more the width of the cavity. This removing may include removing the excess BOX and piezoelectric material to provide a predetermined amount in reduction of thermal resistance between the conductor pattern and the substrate. This removing may include removing the excess BOX and piezoelectric material from locations immediately adjacent to (e.g., touching) contact layers and/or under contact bumps. It may include removing the BOX and piezoelectric material from outside of the XBAR resonators or diaphragms of an RF filter, such as from locations beside a cavity over which the resonator or diaphragm spans (e.g., is suspended or extends).

Figure 5A:
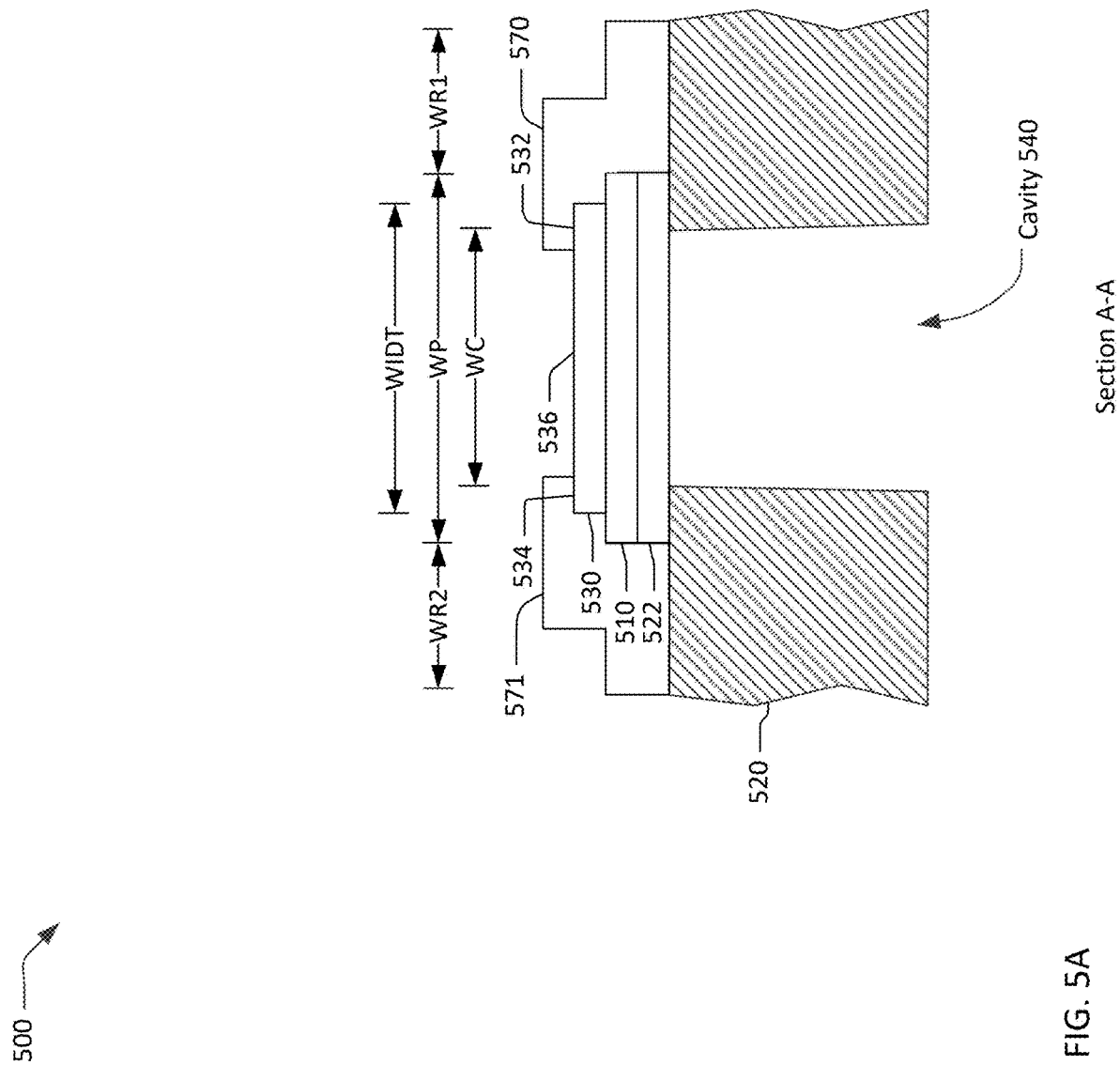
FIG. 5A is a schematic cross-sectional view of XBAR device having predetermined areas of the bonding layer and piezoelectric layer removed from selected locations.

FIG. 5A is a schematic cross-sectional view of XBAR device 500 having predetermined areas of the bonding layer 522 (e.g., BOX layer) and piezoelectric layer 510 removed from selected locations over the surface of the substrate of the device to provide a predetermined amount in reduction of thermal resistance between the IDT pattern 536 and the substrate 520. Device 500 may represent device 100 and/or 300. FIG. 5A may be a view of the filter device at the section A-A of FIG. 1, section B-B of FIG. 1, and/or of plane A-A of FIG. 3A. FIG. 5A shows filter device 500 comprising substrate 520 having cavity 540. BOX layer 522 is formed on the substrate and spans over the cavity 540. Piezoelectric plate 510 is bonded to the bonding layer 522 and spans the cavity 540. In some cases, bonding layer 522 does not exist over the cavity 540 and is only between where the plate is attached to the substrate.

An interdigital transducer (IDT) 530 formed on a front surface of the piezoelectric plate 510 has busbars 532 and 534; and interleaved fingers 536. Each of the busbars is attached to a set of fingers that form interleaved fingers 536. Fingers 536 may span or be over cavity 540. In some cases, part of the busbars of the IDT are also over the cavity. In other cases, all of the busbars are over the substrate 520 but not over the cavity. At least portions of the busbars are over the substrate (e.g., not over the cavity) to better conduct heat generated in the IDT to the substrate.

Device 500 has width WC of cavity 540; width WP of layers 522 and 510; width WIDT of IDT 530. It also has lengths of the cavity, layers and IDT that are related to the widths, such as noted in FIGS. 1-3B. The widths and corresponding length may define a perimeter of the cavity, layers (e.g., diaphragm) and IDT.

Second metal layers 570 and 571 of M2 material are attached to the top of the substrate 520; to the side surfaces of bonding layer 522; to the side surfaces and part of the top surface of the piezoelectric layer 510; and to the side surfaces and part of the top surface of the IDT 536, such as to the top of the busbars and not to the top of the fingers 536. In some cases, the second metal layers 570 and 571 are a single metal layer extending around a perimeter of and form an island of the bonding layer 522, plate 510 and IDT 530.

The materials that can be used for the substrate, bonding layer, piezoelectric plate/layer, IDT, fingers, busbars, conductor pattern of FIGS. 5A-5E may be the same as those described for FIGS. 1-4. The material of layer M1 and layer M2 of FIGS. 5A-5E may be the same as those described for FIGS. 1-4. The bonding layer 522 may be BOX such as silicon dioxide, Al2O3, silicon nitride, silicon carbide, SiOC, aluminum nitride, a metal oxide, another oxide or another proper bonding material. It can be multiple layers of one or more of such materials.

The heat generated in or by the diaphragm 510 during filtering may be conducted through the fingers 536 to busbars 532 and 534 of the IDT 530; and then to the substrate 520. However, the busbars and other parts of the IDT are separated from the substrate by the piezoelectric layer and a layer of bonding oxide (BOX).

Thus, an improved XBAR resonator 500 that efficiently conducts heat from the fingers 536 and busbars 532 and 534 to the substrate 520 is formed by removing predetermined areas (e.g., excess amounts) WR1 and WR2 of the bonding layer 522 and piezoelectric layer 510 from selected locations of the surface of the substrate of the device 500 to provide a predetermined amount in reduction of thermal resistance between the conductor pattern and the substrate. Removing may be done by an island etch concept that removes layers 522 and 510 around a perimeter of the resonator to leave an island of the layers 522, 510 and IDT 530 over cavity 540. In this case, areas WR1 and WR2 are a single area extending around a perimeter of and form an island of the bonding layer 522, plate 510 and IDT 530.

It is considered that multiple devices 500 may exist as islands on substrate 520 with areas WR1 and WR2 separating each island. Here, layer 570 may extend partially between each island. In other cases, it may extend completely between all of the islands.

Removing the predetermined areas WR1 and WR2 causes the predetermined amount of reduction in 'contact thermal resistance'. The predetermined amount in reduction of thermal resistance between the conductor pattern and the substrate may be a reduction of 2×, 3×, 5× or 10× the thermal resistance. In some cases, it is a 3× reduction. In other cases, it is a 10× reduction. The area sizes of areas WR1 and WR2 can be selected or predetermined based on the predetermined amount of reduction desired. WR1 and WR2 may range from 1 um to 200 um, with maximum extent determined by resonator to resonator or resonator to bump offsets. WR1 and WR2 need not be identical to each other, but are not excluded from being identical.

The selected locations are predetermined areas WR1 and WR2 where removal of bonding layer 522 and piezoelectric layer 510 take place. For example, the bonding layer 522 and piezoelectric layer 510 span the cavity and have excess portions that extend a certain length past the perimeter of the cavity. The excess portions may extend a certain length and width distance (WR1 and WR2) past the length and width (WC) perimeter of the cavity. The excess portions may be a perimeter of the bonding layer and piezoelectric layer that extend in the length and width past the perimeter of the cavity by: a) more than 5, 10 or 20 percent; or b) between 2 and 25 percent of the length distance and width distance of the cavity. The removal regions WR1 and WR2 correspond to some or all of the area covered by metal routing between resonators or between a resonators and bumps.

The IDT and second metal conductors may be metal or another proper conductive material. The substrate may be silicon or another proper substrate semiconductor material. The bonding layer may be BOX such as silicon dioxide or another proper bonding material.

The piezoelectric layer 510 may be etched away from over layer 510 at areas WR1 and WR2 using a selective etching technique or chemistry that removes layer 510 but does not remove any of the layer 522. Here, layer 522 may be an etch stop layer for etching layer 510.

The bonding layer 522 may be etched away from over substrate 520 at areas WR1 and WR2 using a selective etching technique or chemistry that removes layer 522 but does not remove any or a functionally relevant thickness of the substrate 120. Here, substrate 520 may be an etch stop layer for etching layer 522.

In some cases, both the bonding layer 522 and piezoelectric layer 510 are etched away from over substrate 520 at areas WR1 and WR2 using a selective etching technique or chemistry that removes both layers but does not remove any or a functionally relevant thickness of the substrate 120. Here, substrate 520 may be an etch stop layer for etching both layers.

Removing the areas of BOX and LN layers 510 and 522 may not impact the electrical isolation path of the IDT because there is no capacitance between M2 layers and the Si substrate layer 520 if the BOX+LN is removed from the areas WR1 and WR2. For example, a trap-rich layer with high electrical resistance formed over the surface of substrate 520 at the areas WR1 and WR2 will likely be sufficient to ensure the electrical isolation path. In some cases, it will be desirable to maintain high resistance with a barrier layer formed over the surface of substrate 520 at the areas WR1 and WR2, such as an oxidized Ti layer. Such a layer would be of thickness between 0 nm and 20 nm to minimize parasitic thermal resistance contributions.

Figure 5B:
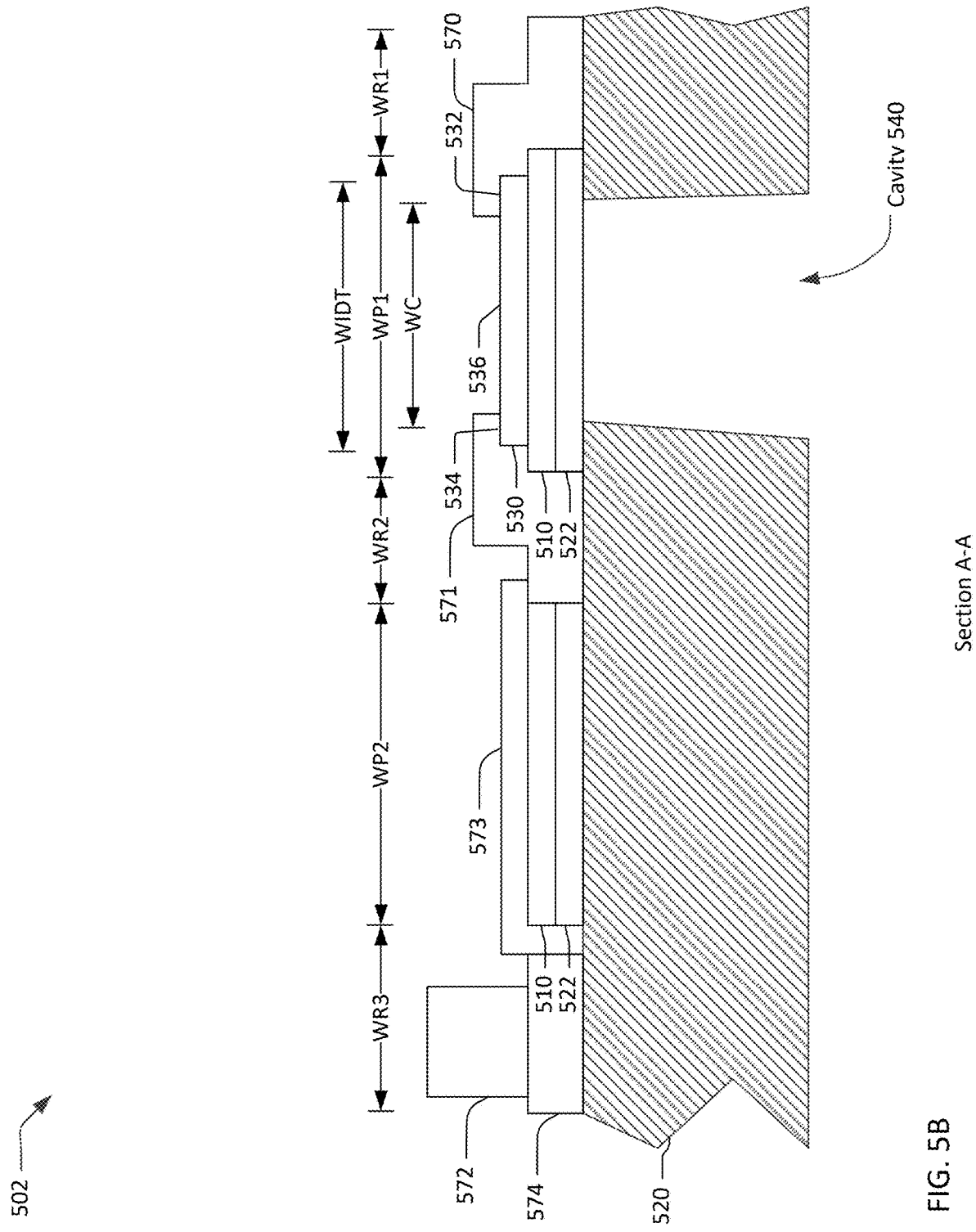
FIG. 5B is a schematic cross-sectional view of XBAR device having three predetermined areas of the bonding layer and piezoelectric layer removed from selected locations.

FIG. 5B is a schematic cross-sectional view of XBAR device 502 having three predetermined areas of the bonding layer 522 and piezoelectric layer 510 removed from selected locations over the surface of the substrate of the device to provide a predetermined amount in reduction of thermal resistance between the IDT pattern 536 and the substrate 520. Device 502 may represent an alternative configuration of device 500 that includes width WP1 and another width WP2 of layers 522 and 510; and width WR3 of a third area of the layers 522 and 510 that is removed for reasons similar to removal of area WR1 and WR2. Device 502 also has bump 572 attached to layer 571 as shown. Bump 572 may be described by bump 472.

Widths WP2 and WR3 may have lengths that are related to the widths, such as noted in FIGS. 1-3B and 5A. The widths and corresponding length may define a perimeter of the layers and area.

For device 502, second metal layer 573 of M2 material is attached to the side surfaces of bonding layer 522 at WP2; to the side surfaces and the top surface of the piezoelectric layer 510 at WP2; and to a top surface of layer 571. It also has second metal layer 574 of M2 material attached to the top of the substrate 520 at WR3; to a side surface of layer 573; and with bump 572 attached to its top surface. In some cases, the second metal layers 573 and 574 are separate metal layers extending through trenches formed in the bonding layer 522 and plate 510 beside the resonator or layer 571. The BOX 522 and LN 510 over length WP2 may remain in order to provide additional electrical isolation, in regions where trap-rich Si or high resistance metal films do not provide sufficient electrical isolation. However, WP2 may also be zero, such that WR2 and WR3 are directly adjacent.

Thus, an improved XBAR resonator 502 that efficiently conducts heat from the fingers 536 and busbars 532 and 534 to the substrate 520 is formed by removing predetermined areas (e.g., excess amounts) WR1, WR2 and WR3 of the bonding layer 522 and piezoelectric layer 510 from selected locations of the surface of the substrate of the device 502 to provide a predetermined amount in reduction of thermal resistance between the conductor pattern and the substrate. Removing may be done by a trench etch concept that removes layers 522 and 510 in trenches beside a perimeter of the resonator separately from or in addition to the island of the layers 522, 510 and IDT 530 described for FIG. 5A. The minimum size of WR3 is the diameter of the bump 572, which typically ranges from 50 um to 100 um. WR3 may also extend as far as WR2, up to 200 um.

The selected locations and predetermined amounts for device 502 can be the same as for device 500. Etching the bonding layer 522 and piezoelectric layer 510 away from over substrate 520 at the WR areas can be the same in device 502 as for device 500.

Figure 5C:
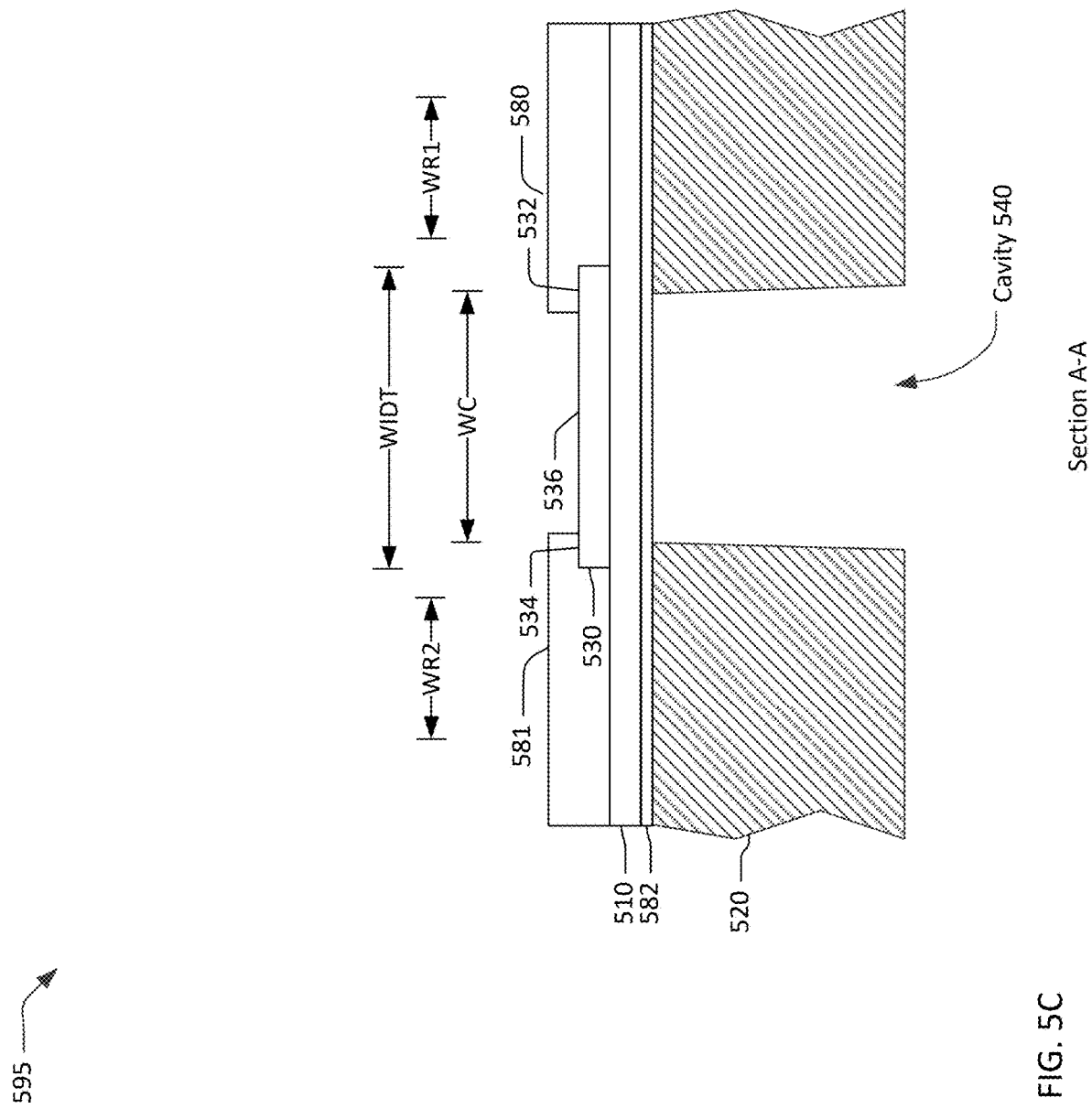
FIG. 5C is a schematic cross-sectional view of XBAR device having a thinned bonding layer at selected locations.

FIG. 5C is a schematic cross-sectional view of XBAR device 504 having a thinned bonding layer 582 at selected locations over the surface of the substrate of the device to provide a predetermined amount in reduction of thermal resistance between the IDT pattern 536 and the substrate 520. Device 504 may represent an alternative configuration of device 500 that includes the layers 582 and 510 in area WR1 and WR2. In some cases, bonding layer 582 does not exist over the cavity 540 and is only between where the plate is attached to the substrate.

For device 504, second metal layer 580 and 581 of M2 material is attached to the side surfaces and a top surface of IDT 530, such as to the top of the busbars and not to the top of the fingers 536; and to the top surface of the piezoelectric layer 510.

In some cases, the second metal layers 580 and 581 are a single metal layer extending around a perimeter of and form an island of the IDT 530. There may be multiple devices as multiple islands as described for FIG. 5A.

Thus, an improved XBAR resonator 504 that efficiently conducts heat from the fingers 536 and busbars 532 and 534 to the substrate 520 is formed by having a thinned bonding layer 582 at selected locations WR1 and WR2 over the surface of the substrate of the device 504 to provide a predetermined amount in reduction of thermal resistance between the conductor pattern and the substrate.

Layer 582 has a thickness of between 50 and 500 nm. The thickness may be between 100 and 400 nm. In some cases, it is between 70 and 130 nm.

Layer 582 may be formed by depositing a thinner layer of the material of layer 522 and/or by polishing layer 522 to the thickness of layer 582. It may be formed from a thicker layer of BOX according to a thin box concept.

In one example, a layer 2 um thick of layer 522 causes or is 80% of the thermal resistance between the IDT 530 and substrate 520. However, using a layer 100 nm thick of layer 582 reduces this 80% of the thermal resistance by at least factor of 4 or 5.

Figure 5D:
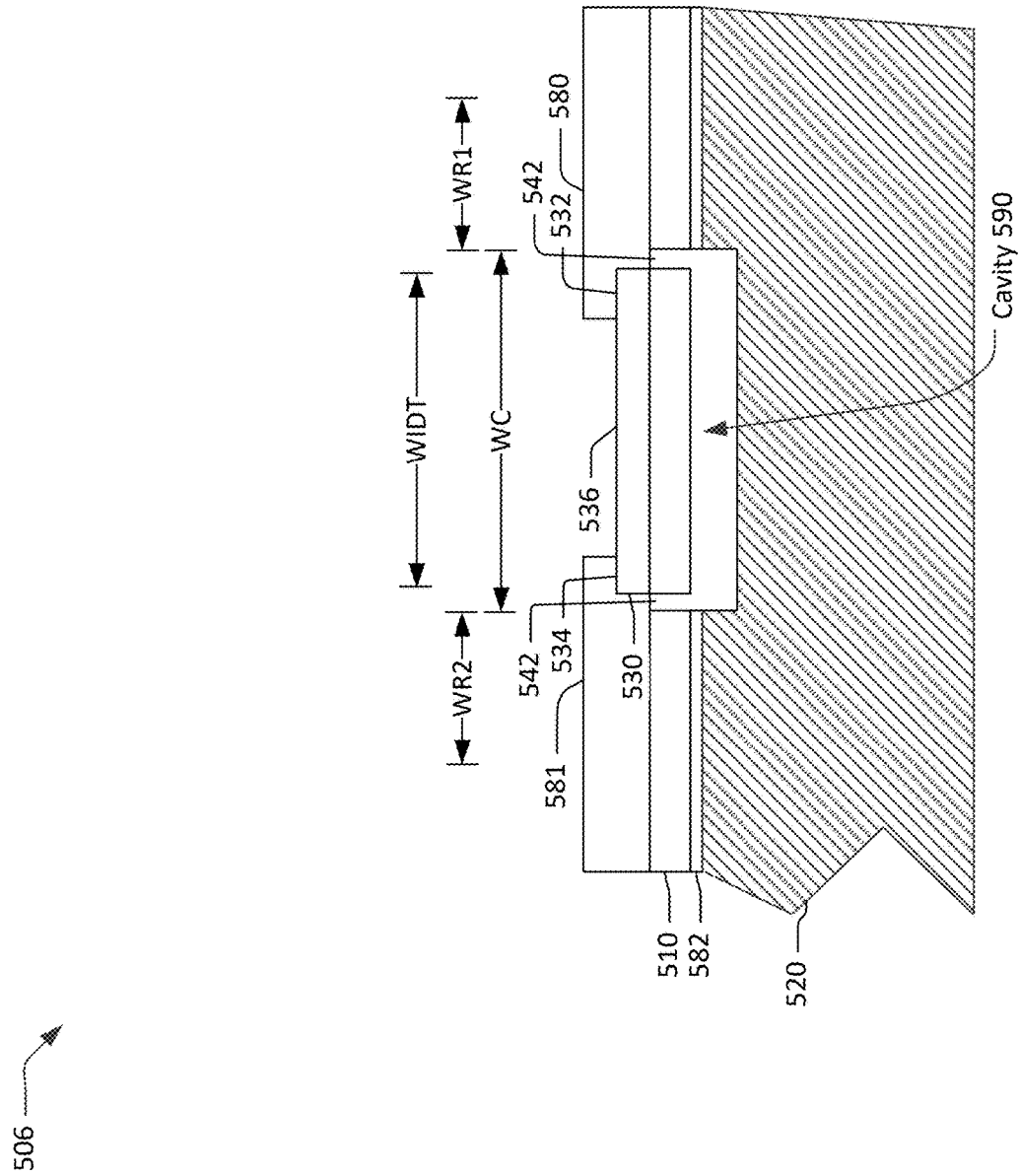
FIG. 5D is a schematic cross-sectional view of XBAR device having a frontside etched cavity and a thinned bonding layer at selected locations.

Using the thinner layer 582 also allows the cavity 540 to be formed by a frontside etch technique such as describe for FIG. 3A. For example, FIG. 5D is a schematic cross-sectional view of XBAR device 506 having a frontside etched cavity 590 and a thinned bonding layer 582 at selected locations over the surface of the substrate of the device to provide a predetermined amount in reduction of thermal resistance between the IDT pattern 536 and the substrate 520. Device 506 may represent an alternative configuration of device 500 that includes the IDT 530 and layer 510 in area WIDT; and the layers 582 and 510 in area WR1 and WR2. Bonding layer 582 has been etched away during the frontside cavity etch, thus does not exist over the cavity 590 and is only between where the plate is attached to the substrate. In other cases, bonding layer 582 was not removed during the frontside etch and also exists over the cavity 590. Cavity 590 may be similar to cavity 340.

The cavity 590, does not fully penetrate the substrate 520, and is formed in the substrate under the portion of the piezoelectric plate 510 containing the IDT. The cavity 590 may be formed by etching the substrate 520 before attaching the layers 582 and 510 to the substrate. In another case, the cavity 590 is formed by etching the substrate 520 and the layer 582 before attaching the layer 510 to the layer 582 to form the diaphragm of layer 510 over the cavity. Alternatively, the cavity 590 may be formed by etching the substrate 520 with a selective etchant that reaches the substrate through one or more openings 542 provided in the piezoelectric plate 510. Openings 542 may be similar to openings 342. Other than the openings 542, the diaphragm of plate 510 may be contiguous around a large portion of a perimeter of the cavity 590. For example, the diaphragm of layer 510 may be contiguous around at least 50% of the perimeter of the cavity 590. For device 506, second metal layer 580 and 581 of M2 material also cover the locations of the openings 542 in the layer 510.

Thus, an improved XBAR resonator 506 that efficiently conducts heat from the fingers 536 and busbars 532 and 534 to the substrate 520 is formed by having a frontside etched cavity 590 and a thinned bonding layer 582 at selected locations WR1 and WR2 over the surface of the substrate of the device 506 to provide a predetermined amount in reduction of thermal resistance between the conductor pattern and the substrate.

Layer 582 may be formed prior to the frontside etching of cavity 590 using a thin BOX with frontside etch concept. Etching to form cavity 590 may use a patterned 'tub' to define the cavity, which etches into a Si material of substrate layer 520 below and in the cavity area. The tub area of the substrate 520 may be prepatterned, filled with a sacrificial layer and undergo chemical mechanical polishing (CMP) to re-planarize the tub material prior to etching of the Si material.

As noted for FIG. 5C, the thin layer 582 is has less thermal resistance than a thicker layer 522, such as a thicker layer that might be needed for a non-patterned wafer formed cavity.

Cavity 590 may be a formed as an air cavity with hole(s) 542 opened from un-patterned LN of layer 510 during etching. The Si substrate may be pre-patterned with selective etch stop features to define the etch cavity, or may be un-patterned such that cavity size is controlled by etchant type and exposure. Then metal 580 and 581 are formed over the layer 510, openings 542 and parts of IDT 530, without entering the air cavity below.

Figure 5E:
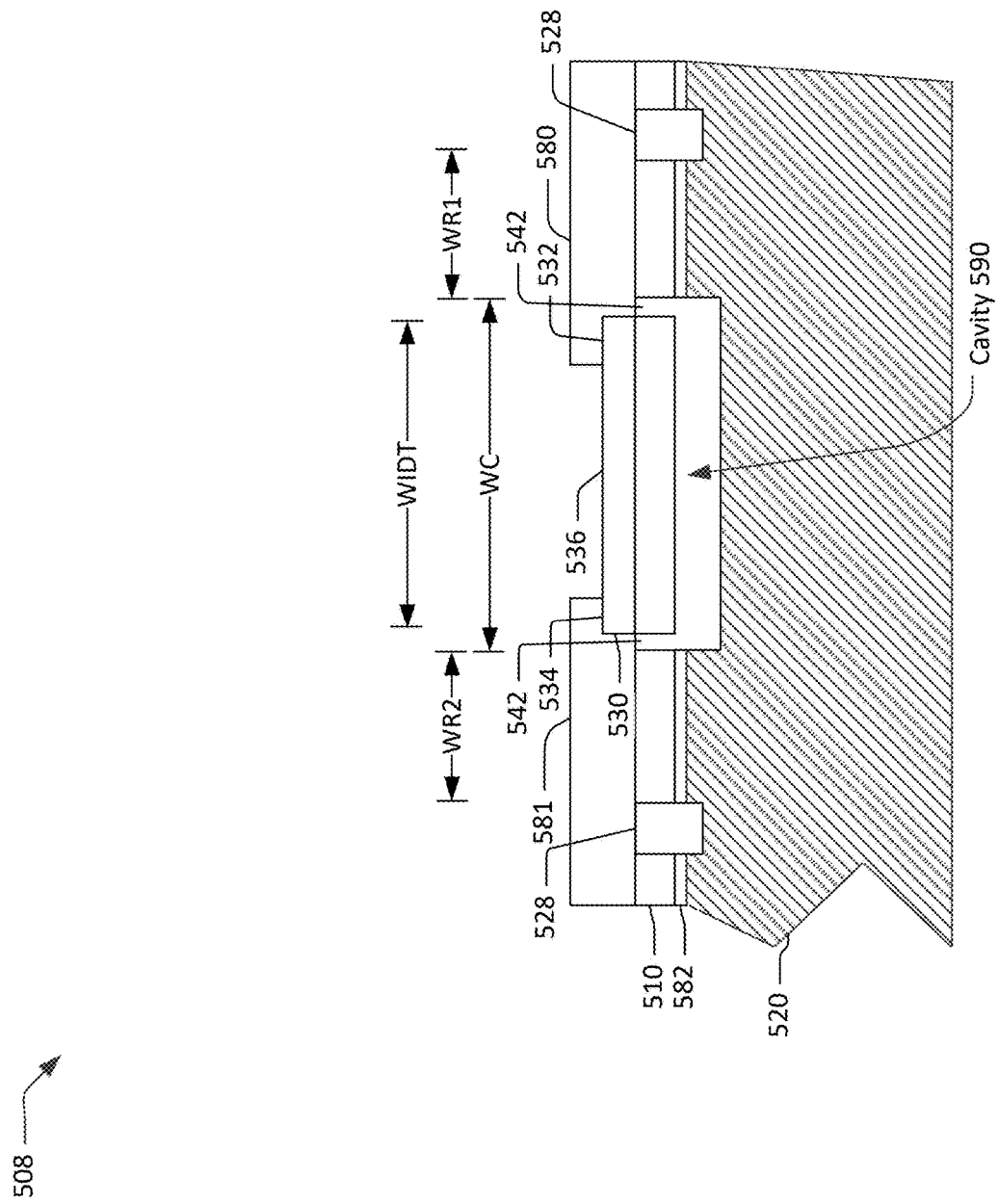
FIG. 5E is a schematic cross-sectional view of XBAR device having thermal vias; a frontside etched cavity and a thinned bonding layer at selected locations.

Using the thinner layer 582 also allows thermal vias to be etched through the layers 510 and 582 at locations around the resonator perimeter to further reduce thermal resistance between the IDT 530 and substrate 520. For example, FIG. 5E is a schematic cross-sectional view of XBAR device 508 having thermal vias 528; a frontside etched cavity 590 and a thinned bonding layer 582 at selected locations over the surface of the substrate of the device to provide a predetermined amount in reduction of thermal resistance between the IDT pattern 536 and the substrate 520. Device 508 may represent an alternative configuration of device 506 that includes thermal vias 528. Bonding layer 582 does not exist over the cavity 590. In other cases, bonding layer 582 exists over the cavity 590. The thermal vias 528 may range from 2 um to 100 um in diameter or width. Their cross sections may be circular, square, elliptical or rectangular. Extent of the thermal vias into the Si substrate 520 may range from 0.5% to 50% of the Si substrate thickness; typical dimensions would then be 1 um to 100 um for a 200 um Si substrate 520. Thermal vias may be composed of conductive metals such as Au, Cu, Al, Si, Ti, Ni; alloys of these materials; or by layering of these materials additively.

Thermal vias 528 may be formed by a deposition of additional metal or poly silicon areas in layers 510, 582 and to a top surface or through a thickness of layer 520 to create a heat sink, which increases thermal conductivity from the IDT to the substrate. The material in areas 528 may be a metal or a polysilicon material selected to have thermal properties that transfers heat from the IDT busbars 534 532 to the silicon layer 520. Areas may be formed through layers 510, 582 and optionally 520 when forming openings 542 by also etching through those layers at the locations of vias 528 and then depositing the metal or polysilicon in those areas, such as when depositing layer 580 and 581. Vias 528 may form a ring around the cavity 590 to uniformly conduct heat created in the resonator plate 510 to the substrate. There may be multiple rings around multiple cavities for multiple device islands as described for FIG. 5A.

The addition of low thermal resistance vias 528 through the high thermal resistance layers 510 and 582 lowers the thermal resistance of the path from the IDT, through the layers 580/581 and to the substrate 520 by creating vias 528 of lower thermal resistance for the heat to flow through from the layers 580/581 to the substrate than the path through layer 510 and 582. This reduces the temperature rise of a given plate resonator for a given input heat load.

Thus, an improved XBAR resonator 508 that efficiently conducts heat from the fingers 536 and busbars 532 and 534 to the substrate 520 is formed by having thermal vias 528; a frontside etched cavity 590 and a thinned bonding layer 582 at selected locations WR1 and WR2 over the surface of the substrate of the device 508 to provide a predetermined amount in reduction of thermal resistance between the conductor pattern and the substrate.

Thermal vias 528 may be formed prior or during the frontside etching of openings 542 and/or of cavity 590 using a thin box frontside etch with a thermal vias concept. Different etchants may be used for the cavity than for the vias, such as by using a wet etch for the cavity and a dry etch for via openings. The etching could require multiple photolithography processing steps. In another case, a more complex 'covering' of cavity openings can be used during patterning of the vias openings prior to deposition of the via material.

One advantage of using vias 528 is that it is easier to define thermal vias than to do an additional photolithography processing step such as to flow additional metal to lower thermal resistance between the IDT and substrate.

It is also noted that for backside etches of cavity 540 in FIGS. 5A-5C, a thick SiO2 layer 522 of between 1 and 3 um may be needed as a backside etch stop to prevent layer 510 from being etched when the cavity is etched. On the other hand, for frontside etches of cavity 590 in FIGS. 5D-5E, thinner layer 582 may be thin oxide of 200 nm to 400 nm BOX material.

Description of Methods

Figure 6:
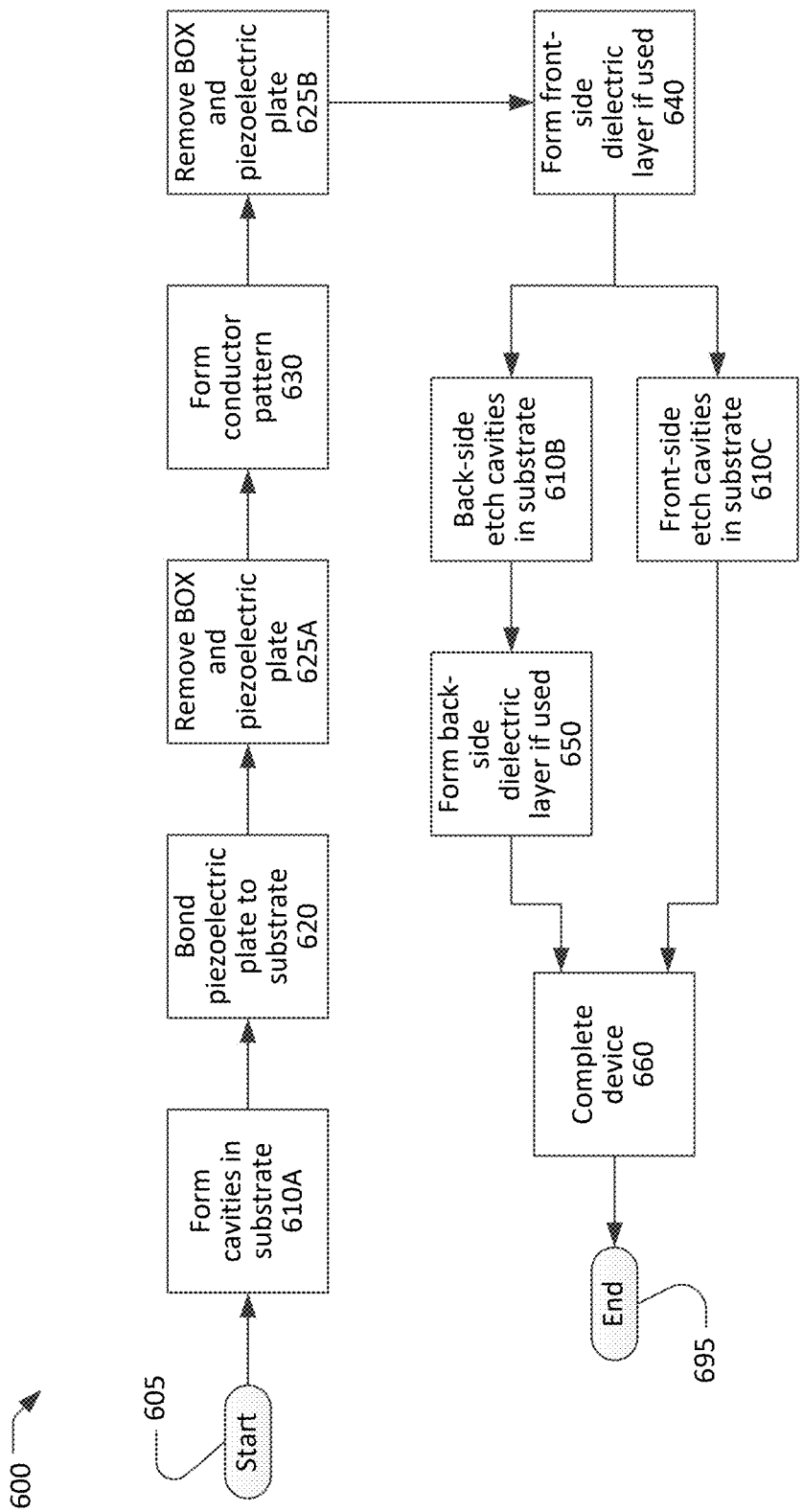
FIG. 6 is a simplified flow chart showing a process for making an XBAR with low thermal impedance between electrical conductors and the substrate.

FIG. 6 is a simplified flow chart showing a process 600 for making an XBAR acoustic resonator with low thermal impedance between and that thus efficiently conducts heat from the IDT or busbars to the substrate. The process 600 includes a) removing a predetermined area of the BOX and/or piezoelectric layers 510 and 522 from selected locations of the surface of the substrate, using a thinner layer 582 of the BOX material, and/or using thermal vias 528 to provide a predetermined amount in reduction of thermal resistance between the conductor pattern and the substrate.

The process 600 starts at 605 with a substrate and a plate of piezoelectric material and ends at 695 with a completed XBAR or filter, such as shown for FIGS. 5A-5E. As will be described subsequently, the piezoelectric plate may be mounted on a sacrificial substrate or may be a portion of wafer of piezoelectric material. The flow chart of FIG. 6 includes only major process steps. Various conventional process steps (e.g., surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The flow chart of FIG. 6 also captures two variations of the process 600 for making an XBAR which differ in when and how the bonding layer and piezoelectric material are removed from predetermined areas, such as shown for FIGS. 5A-5C. For example, excess BOX and piezoelectric material may be removed at step 625A or 625B. Only one of these steps is performed in each of these two variations of the process 600. In another variation, some of the excess BOX and piezoelectric material may be removed at step 625A and more of them are removed at step 625B.

The piezoelectric plate may be, for example, Z-cut, rotated Z-cut, or rotated Y-cut lithium niobate or lithium tantalate. The piezoelectric plate may be some other material and/or some other cut as previously noted for plate 110. The substrate may be silicon. The substrate may be some other material that allows formation of deep cavities by etching or other processing.

In one variation of the process 600, one or more cavities are formed in the substrate at 610A, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate bonding material, such as an oxide, is formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded using the bonding layer, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

In either variation of process 600, bonding layer 522 or 582 is used to bond the plate to the substrate, such as described for FIGS. 5A-5E. Using layer 582 will be using a thinner layer 582 of the BOX material to provide a predetermined amount in reduction of thermal resistance between the conductor pattern and the substrate, such as described for FIGS. 5D-5E. The thinner layer 582 of the BOX material may be used with thermal vias 528 formed during any one or more processes of process 600 and/or as described for FIG. 5E to provide a predetermined amount in reduction of thermal resistance between the conductor pattern and the substrate.

In one variation of the process 600, at 625A the predetermined areas of the BOX and piezoelectric plate are removed, such as described for FIGS. 5A-5C. This may be removing predetermined areas after the piezoelectric plate is bonded to the substrate at 620 and before the conductor pattern is formed at 630. The predetermined areas may be removed by patterning and etching. Here, substrate layer 520 can be used as an etch stop for removing the predetermined areas of the piezoelectric material. Removing at 625A may also include removing areas of the plate, BOX and optionally of the substrate for forming vias 528.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDTs are formed prior to bonding the plate to the substrate.

In another variation of the process 600, at 625B the predetermined areas of the BOX and piezoelectric plate are removed after the conductor pattern is formed at 630 and before front side dielectric is optionally formed at 640. This may be removing as noted at FIGS. 5A-5C. The predetermined areas may be removed by patterning and etching. Removing at 625B may also include removing areas of the plate, BOX and optionally of the substrate for forming vias 528.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIGS. 1 and 5A-5C.

In a third variation of the process 600, one or more cavities in the form of recesses in the substrate layer 320 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate layer 320, and the resulting resonator devices will have a cross-section as shown in FIGS. 3A and 5D-5E.

In all variations of the process 600, the filter or XBAR device is completed at 660. Actions that may occur at 660 include depositing metal layer M2, such as layers 570, 571, 573, 574, 580 and 581 as per FIGS. 5A-5E. They may also include depositing material of vias 528.

Actions that occur at 660 may also include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-3C and 5A-5E may show examples of the XBAR device or resonator after completion at 660.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device with low thermal impedance comprising:
    a substrate having a surface;
    a single-crystal piezoelectric plate having front and back surfaces, the back surface attached to the surface of the substrate via a bonding oxide (BOX) layer except for a portion of the piezoelectric plate including a diaphragm that spans a cavity; and
    a conductor pattern including an interdigital transducer (IDT) at the single-crystal piezoelectric plate such that interleaved fingers of the IDT are at the diaphragm,
    wherein the single-crystal piezoelectric plate and the BOX layer are each removed at respective locations over the surface of the substrate to provide lower thermal resistance between the conductor pattern and the substrate, and
    wherein the respective locations where each of the single-crystal piezoelectric plate and the BOX layer are removed at least partially overlap each other.

2. The acoustic resonator device of claim 1, wherein the removed piezoelectric plate and the BOX layer are a predetermined area of a bonding layer and piezoelectric layer that are removed from selected locations of the surface of a substrate of the device to provide a predetermined amount in reduction of thermal resistance between the conductor pattern and the substrate.

3. The acoustic resonator device of claim 2, further comprising a second metal layer that is attached to:
    a top of the substrate;
    a side surface of the bonding layer;
    a side surface and part of the front surface of the piezoelectric layer; and
    a side surface and part of a top surface of the IDT.

4. The acoustic resonator device of claim 3,
    wherein the interleaved fingers are two sets of fingers and the IDT further comprises a busbar attached to each of the two sets of fingers,
    wherein at least a part of the busbars are over the substrate, and
    wherein the second metal layer is attached to a top surface of the busbars and not to a top surface of the interleaved fingers.

5. The acoustic resonator device of claim 4, wherein the removed piezoelectric plate and the BOX layer extend around a perimeter of and form an island of the bonding layer, the piezoelectric plate and the IDT.

6. The acoustic resonator device of claim 1, wherein the BOX layer and piezoelectric plate exclude excess portions that extend a certain length past a perimeter of the cavity.

7. The acoustic resonator device of claim 6,
    wherein the excess portions are a length and width of a perimeter of the piezoelectric material spanning the cavity that extends more than between 2 and 25 percent past a length and width of the perimeter of the cavity.

8. The acoustic resonator device of claim 1, wherein the substrate is Si, the BOX layer is SiO2, the IDT is metal, an overlapping distance of the interleaved fingers define an aperture of the resonator device, and the piezoelectric plate is one of lithium niobate or lithium tantalate.

9. The acoustic resonator device of claim 1, wherein:
    respective radio frequency signals applied to the IDT excites a primary shear acoustic mode in the piezoelectric plate over the cavity, wherein a thickness of the diaphragm is selected to tune the primary shear acoustic modes in the piezoelectric plate, and further comprising connections to the IDT that form an RF filter input and output.

10. A filter device comprising:
    a substrate;
    a piezoelectric plate supported by the substrate and spanning a cavity, the piezoelectric plate including a diaphragm that spans the cavity;
    a bonding oxide (BOX) layer between the piezoelectric plate and the substrate;
    an interdigital transducer (IDT) at the piezoelectric plate and having interleaved fingers over the cavity;
    wherein the cavity has a perimeter; and
    wherein the BOX layer and the piezoelectric plate are removed from beyond an extension of the perimeter to exclude excess portions from a surface area of the filter device to provide lower thermal resistance between the conductor pattern and the substrate.

11. The filter device of claim 10, wherein the substrate is Si, the BOX layer is SiO2, the IDT is metal, and the piezoelectric plate it one of lithium niobate or lithium tantalate.

12. The filter device of claim 10, wherein the removed piezoelectric plate and the BOX layer are a predetermined area of a bonding layer and piezoelectric layer that are removed from selected locations of a surface of a substrate of the device to provide a predetermined amount in reduction of thermal resistance between the conductor pattern and the substrate.

13. The filter device of claim 12, further comprising a second metal layer that is attached to:
    a top of the substrate;
    a side surface of the bonding layer;
    a side surface and part of a top surface of the piezoelectric layer; and
    a side surface and part of a top surface of the IDT.

14. The filter device of claim 13,
    wherein the interleaved fingers are two sets of fingers and the IDT further comprises a busbar attached to each of the two sets of fingers,
    wherein at least a part of the respective busbars are over the substrate, and
    wherein the second metal layer is attached to a top surface of the busbars and not to a top surface of the interleaved fingers.

15. The filter device of claim 10, wherein a radio frequency signal applied to the IDT excites a primary shear acoustic mode in the piezoelectric plate over the cavity.

16. The filter device of claim 15, wherein a thickness of the piezoelectric plate is configured to tune the primary shear acoustic mode in the piezoelectric plate.

17. A filter device comprising:
a substrate;
a piezoelectric plate over the substrate and spanning a cavity, the piezoelectric plate including a diaphragm that spans the cavity;
a bonding oxide (BOX) layer between the piezoelectric plate and the substrate;
an interdigital transducer (IDT) at the piezoelectric plate and having interleaved fingers over the cavity;
wherein the piezoelectric plate and the BOX layer are removed from selected locations of a surface of the substrate to provide a predetermined amount in reduction of thermal resistance between the conductor pattern and the substrate.

18. The filter device of claim 17, wherein the piezoelectric plate and the BOX layer exclude excess portions that extend a certain length past a perimeter of the cavity.

19. The filter device of claim 17, wherein the substrate is Si, the BOX layer is SiO2, the IDT is metal, and the piezoelectric plate it one of lithium niobate or lithium tantalate.

20. The filter device of claim 17, wherein a radio frequency signal applied to the IDT excites a primary shear acoustic mode in the piezoelectric plate over the cavity; and wherein a thickness of the piezoelectric plate is selected to tune the primary shear acoustic mode in the piezoelectric plate.

* * * * *